(12) United States Patent
Park

(10) Patent No.: US 6,974,988 B2
(45) Date of Patent: Dec. 13, 2005

(54) DRAM CELL STRUCTURE CAPABLE OF HIGH INTEGRATION AND FABRICATION METHOD THEREOF

(75) Inventor: Cheolsoo Park, Seoul (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/700,666

(22) Filed: Nov. 5, 2003

(65) Prior Publication Data

US 2004/0090813 A1 May 13, 2004

Related U.S. Application Data

(62) Division of application No. 10/427,974, filed on May 2, 2003, now Pat. No. 6,797,590.

(30) Foreign Application Priority Data

May 2, 2002 (KR) ...................... 10-2002-0024051

(51) Int. Cl.[7] ............................................. H01L 29/76
(52) U.S. Cl. ...................... 257/296; 257/301; 257/302
(58) Field of Search ................................ 257/290–320

(56) References Cited

U.S. PATENT DOCUMENTS

| 5,291,438 | A | * | 3/1994 | Witek et al. | |
| 6,355,518 | B1 | * | 3/2002 | Wu et al. | 438/246 |
| 6,552,382 | B1 | * | 4/2003 | Wu | 257/305 |

* cited by examiner

*Primary Examiner*—Fetsum Abraham
(74) *Attorney, Agent, or Firm*—Mayer, Brown, Rowe & Maw LLP

(57) ABSTRACT

A DRAM cell structure capable of high integration includes a trench-type capacitor formed in a lower region of a trench, the trench being made vertically and cylindrically in a silicon substrate, and a transistor being formed vertically and cylindrically over the trench-type capacitor, the transistor being connected to the capacitor. A method for fabricating a DRAM cell structure capable of high integration includes the steps of (a) forming a trench vertically and cylindrically in a silicon substrate, (b) forming a trench-type capacitor having a cylindrical plate electrode and a storage node electrode on a lower region of the trench, (c) forming a vertical cylindrical transistor cell structure connected to the trench-type capacitor on an upper region of the trench.

20 Claims, 15 Drawing Sheets

DRAM CELL STRUCTURE CAPABLE OF HIGH INTEGRATION AND FABRICATION METHOD THEREOF

This is a division of Ser. No. 10/427,974, filed May 2, 2003, now U.S. Pat. No. 6,797,590.

FIELD OF THE INVENTION

The present invention relates to a DRAM cell structure capable of high integration and a fabrication method thereof; and, more particularly, to a vertical cylindrical DRAM cell structure capable of high integration connected to a trench-type capacitor and a fabrication method thereof.

BACKGROUND OF THE INVENTION

A DRAM is a device formed by combination of many memory cells composed of a transistor and a capacitor. Recently, DRAMs are being integrated in higher density in response to demands for larger memory capacity. Therefore, techniques for reducing a memory cell size to integrate more memory cells in a confined space have been required.

FIG. 1 illustrates a conventional DRAM cell structure. As shown in FIG. 1, a conventional DRAM cell structure includes a transistor device formed horizontally on a silicon substrate, and a capacitor device having a plate electrode and a storage node electrode formed on a stacked layer over the transistor device.

However, the conventional horizontal DRAM cell structure shown in FIG. 1 has drawbacks. First, integration density is limited due to word-line size and length. Second, it is difficult to secure a large enough size of the capacitor for sufficient capacitance.

SUMMARY OF THE INVENTION

It is, therefore, an object of the present invention to provide a vertical cylindrical DRAM cell structure connected to a trench-type capacitor capable of high integration and a fabrication method thereof.

In accordance with one aspect of the present invention, there is provided a DRAM cell structure capable of high integration, including: a trench-type capacitor formed in a lower region of a trench, the trench being made vertically and cylindrically in a silicon substrate; a transistor formed vertically and cylindrically over the trench-type capacitor, the transistor being connected to the capacitor.

In accordance with another aspect of the present invention, there is provided a method for fabricating a DRAM cell structure capable of high integration, including the steps of (a) forming a trench vertically and cylindrically in a silicon substrate; (b) forming a trench-type capacitor having a cylindrical plate electrode and a storage node electrode on a lower region of the trench; (c) forming a vertical cylindrical transistor cell structure connected to the trench-type capacitor on an upper region of the trench.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF PREFERRED EMBODIMENTS

Hereinafter, a preferred embodiment of the present invention will be described in detail with reference to the accompanying drawings.

Figure 1:
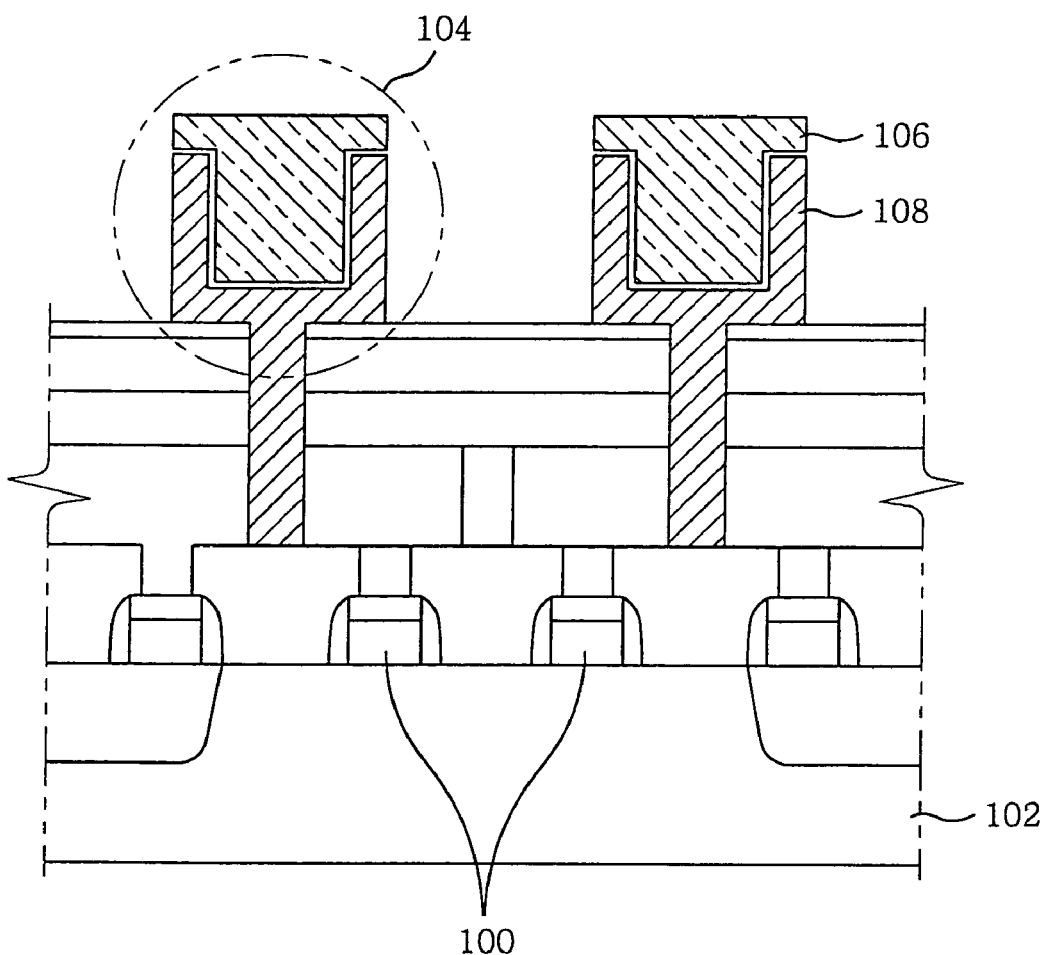
FIG. 1 illustrates a conventional DRAM cell structure.
Figure 2:
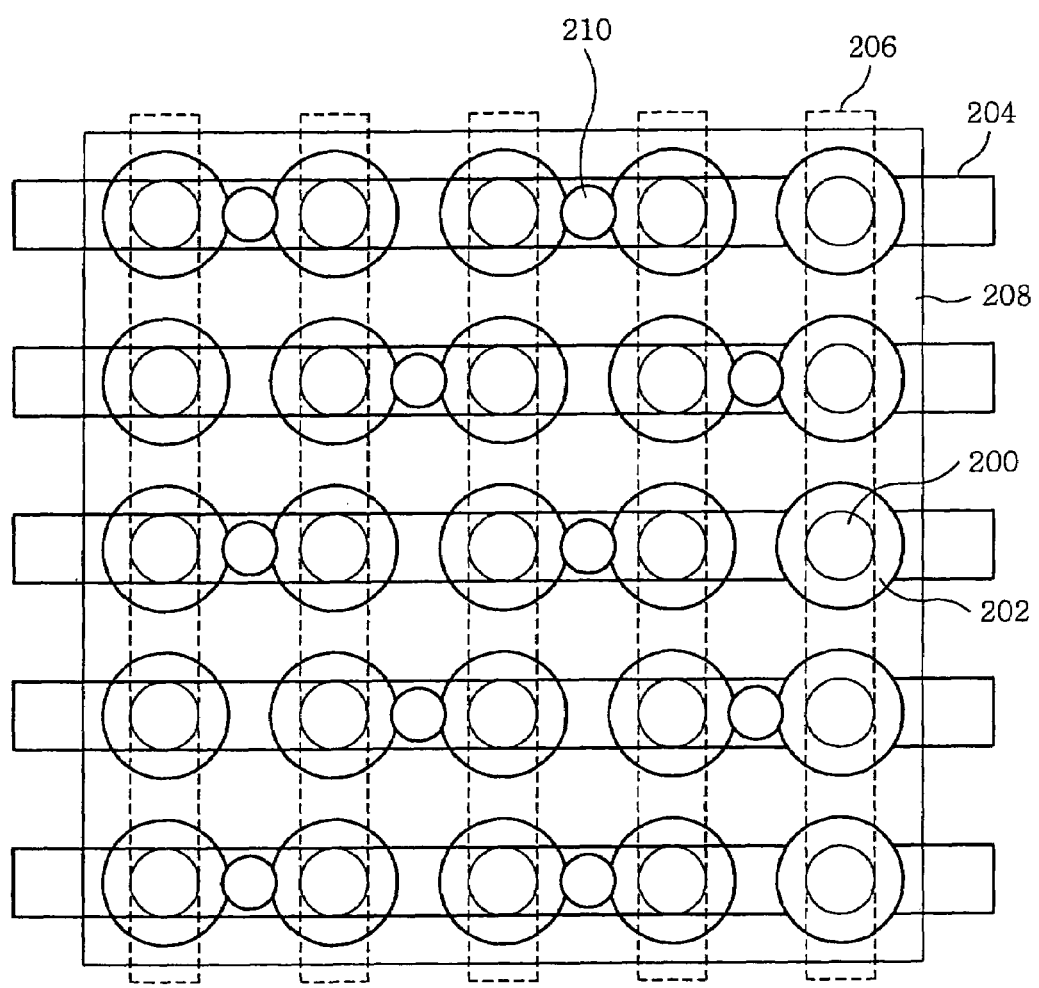
FIG. 2 depicts a silicon substrate on which a vertical cylindrical trench is formed in accordance with a preferred embodiment of the present invention.

FIG. 2 illustrates a layout for fabricating a vertical cylindrical DRAM cell having a trench-type capacitor in accordance with a preferred embodiment of the present invention. First, a vertical cylindrical trench is formed on a silicon substrate 208 by using a trench mask 200 and an isolation mask 202 patterned in circular form. Next, employing a damascene method, a word-line contact is formed by using a word-line mask 206 and a bit-line mask 204. And next, a bit-line contact plug is formed by using a bit-line contact mask 210. Bit-line electrode material is deposited on the bit-line contact plug, and then a bit-line is formed by using a bit-line formation mask 204.

FIGS. 3A–3M illustrate a method for fabricating a DRAM cell connected to a trench-type capacitor and formed vertically and cylindrically on a silicon substrate to thereby increase an integration density in accordance with a preferred embodiment of the present invention. Hereinafter, a transistor device is assumed to be n-type, but the same principle can be applied for p-type case as well.

Figure 3A:
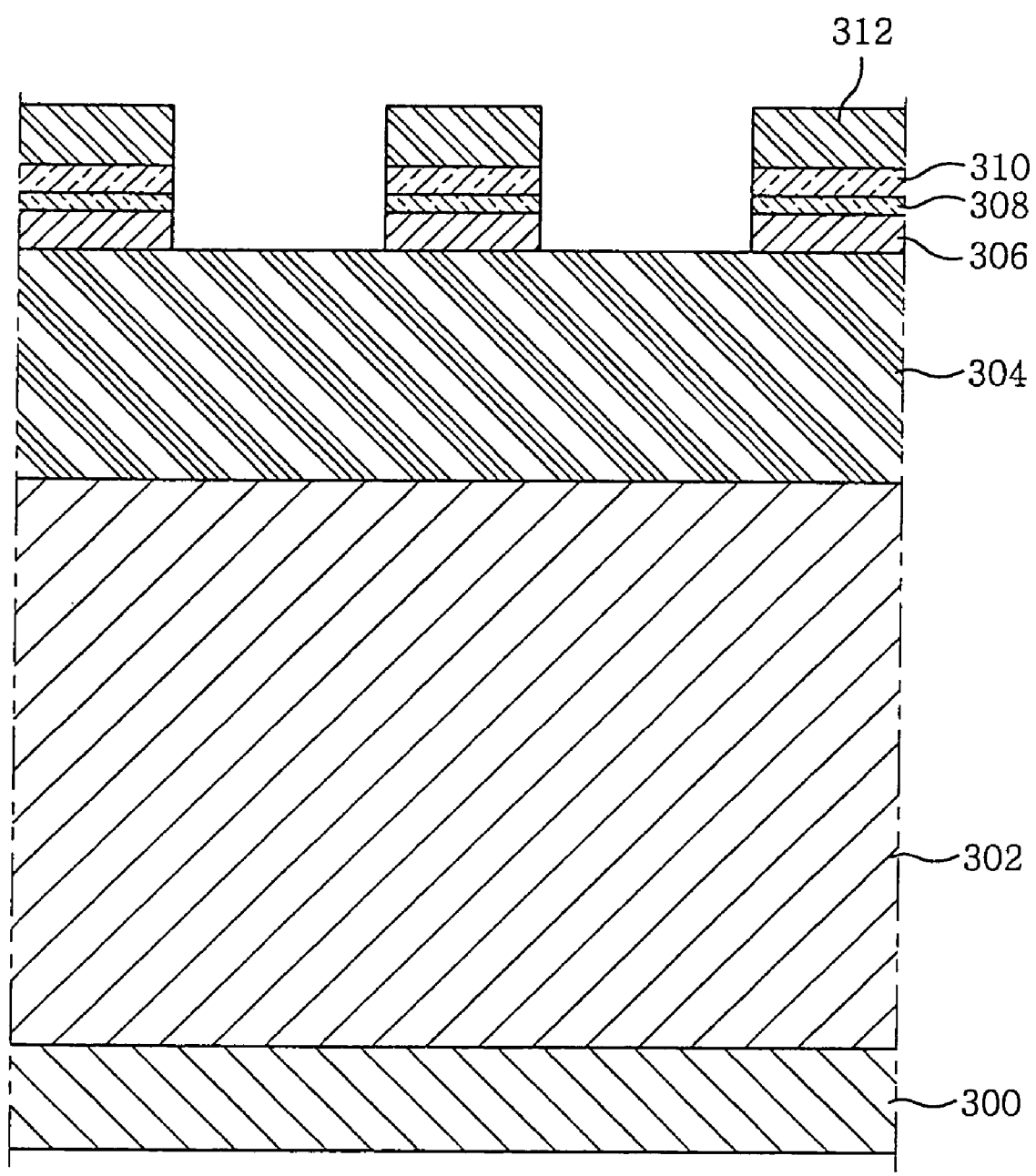
FIGS. 3A–3M explain a method for fabricating a vertical cylindrical DRAM cell in accordance with a preferred embodiment of the present invention.

In order to form a trench for fabricating a vertical cylindrical DRAM cell in a silicon substrate as shown in FIG. 2, a buried n-well 302 is formed on a silicon substrate 300, and then a p-well 304 is formed on the buried n-well 302 as illustrated in FIG. 3A. Next, a first oxide film 306, a first nitride film 308 and a second oxide film 310 are sequentially deposited, and then a photoresist layer for a trench mask patterning is deposited on the second oxide layer 310. Next, through a photolithography process and an etching process, a trench mask 312 is formed by patterning the photoresist on a portion to be etched for making a trench. Then, the second oxide film 310, the first nitride film 308 and the first oxide film 306 are sequentially etched by using the patterned trench mask 312.

Figure 3B:
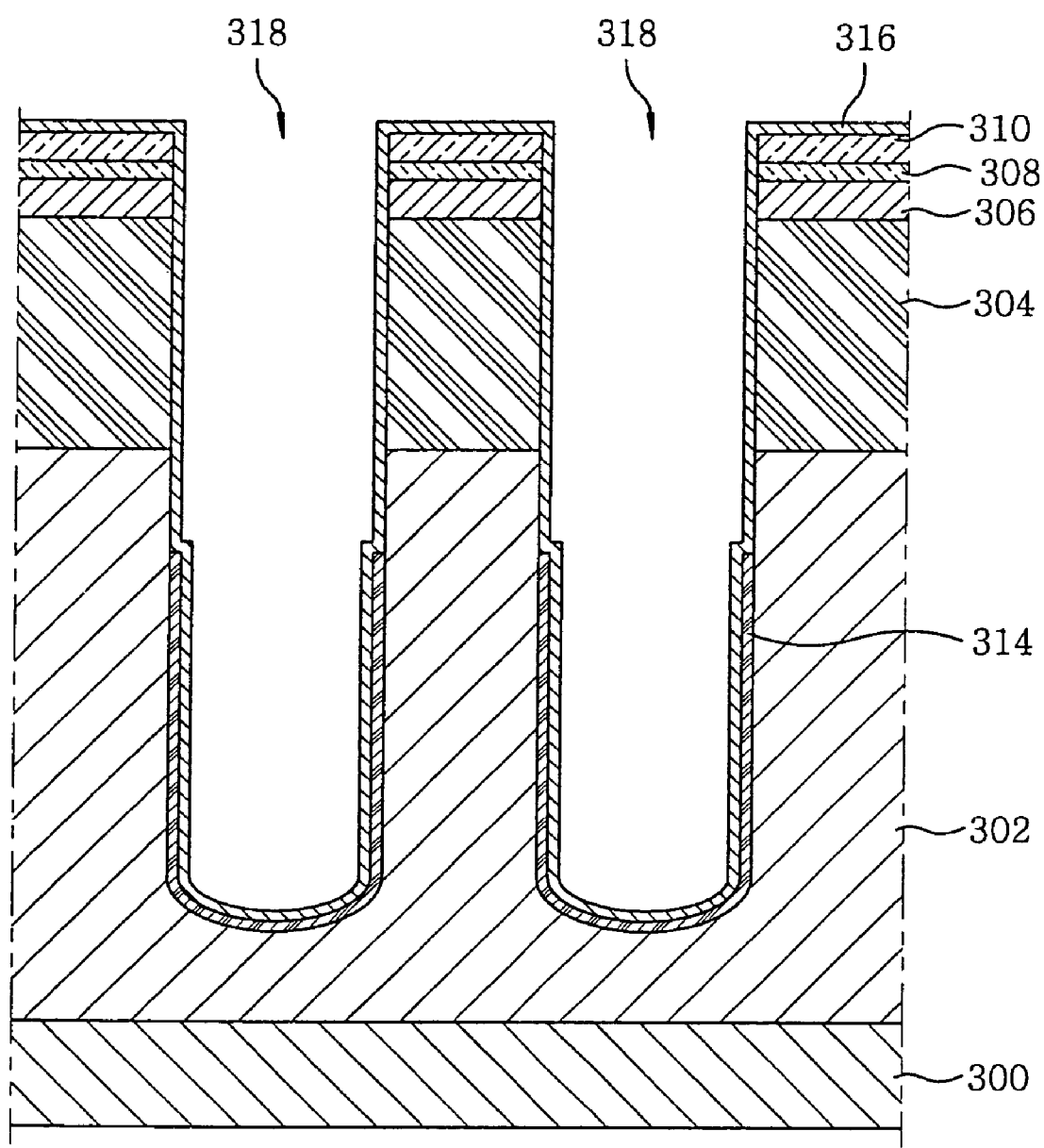

As illustrated in FIG. 3B, the trench mask 312 is then removed, and a cylindrical trench 318 for fabricating a vertical cylindrical DRAM cell is formed by etching a silicon substrate at the portion for making a trench, wherein the second oxide layer 310 is used as an etching mask. The trench etching is performed by using a high dry etching selection ratio of oxide and silicon to a depth of about several micrometers or more. Next, an LPTEOS layer 314 doped with n-type impurity, e.g., phosphorous, is deposited and coated with photoresist, and then etched back down to the p-well region 304. Next, the photoresist is removed, the exposed LPTEOS is removed by dry etching, and then a third oxide layer 316 is deposited.

Figure 3C:
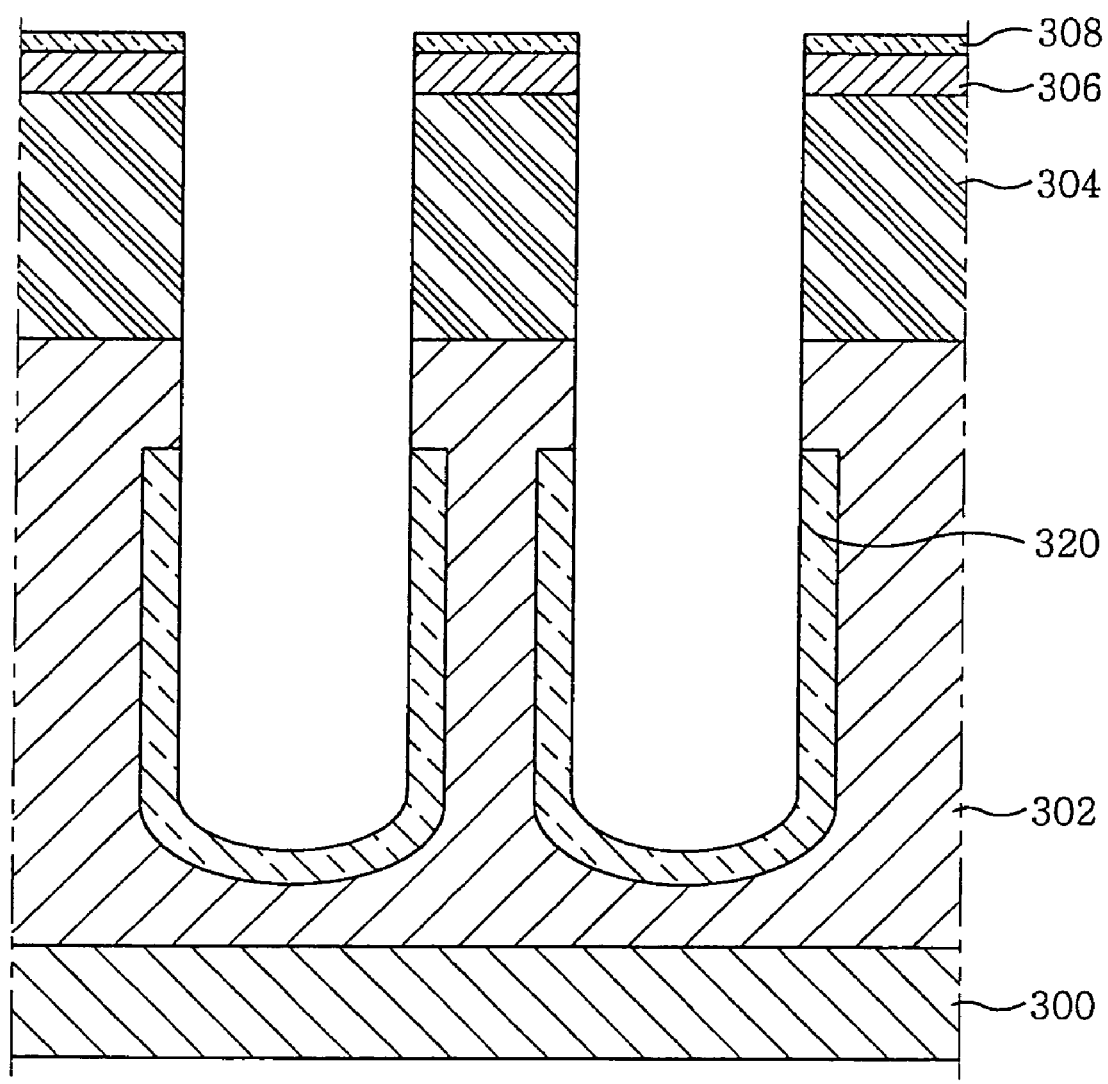

As illustrated in FIG. 3C, a plate electrode 320 is then formed in the buried n-well region 302 by doping the LPTEOS layer 314 with phosphorous and diffusing the phosphorous into the silicon substrate through an annealing process. Next, the p-doped LPTEOS layer 314 and the third oxide layer 316 are removed by wet etching.

Figure 3D:
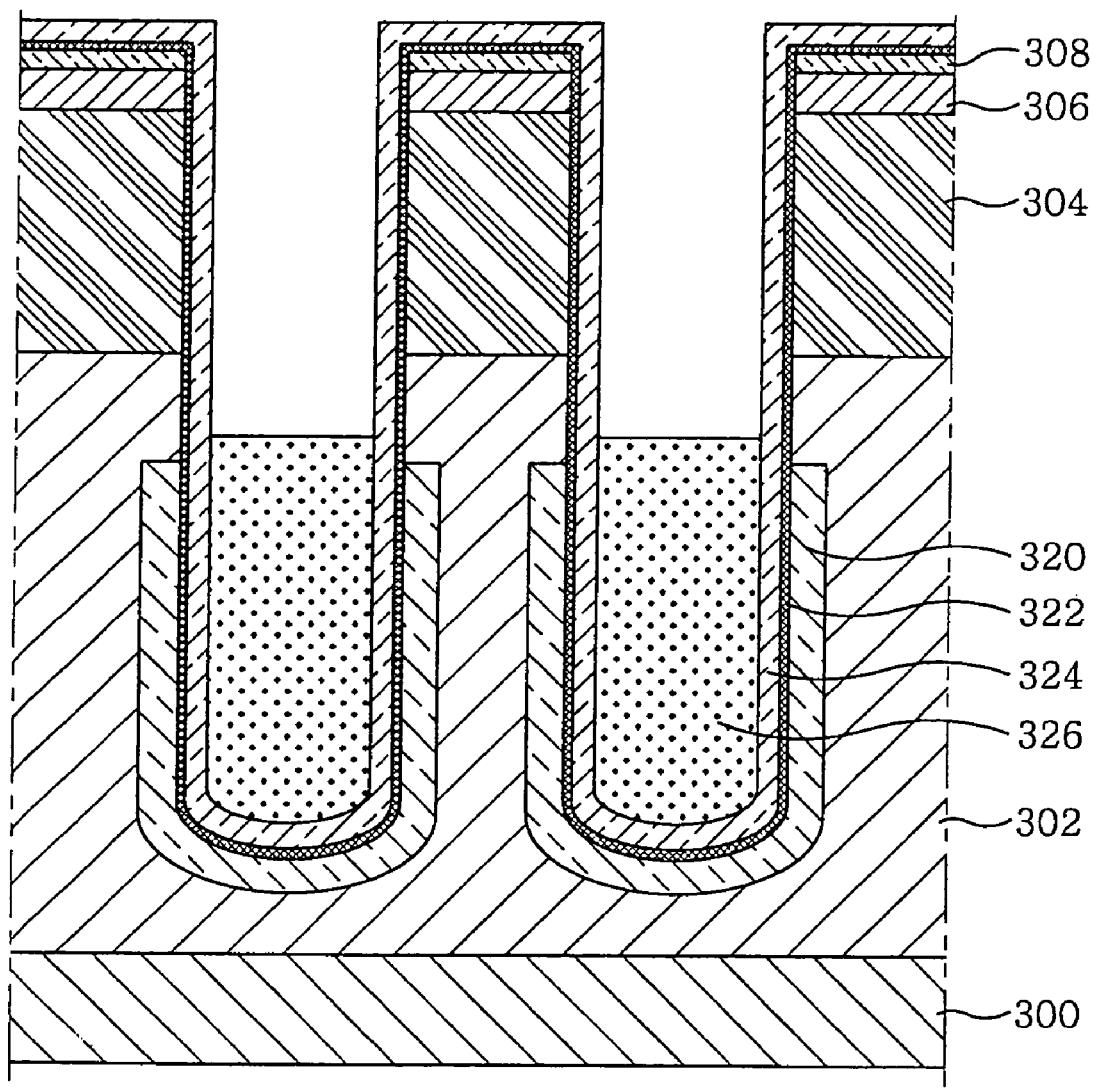

Referring to FIG. 3D, a storage capacitor insulation film 322 and a storage node 324 formed by doping polysilicon are sequentially deposited on a surface of the silicon substrate of FIG. 3C. A fourth oxide layer 326 is then stacked in the capacitor-formed trench to thereby fill the trench. Next, the fourth oxide layer 326 is etched back up to the plate electrode 320 by using a high selection ratio of oxide and poly.

Figure 3E:
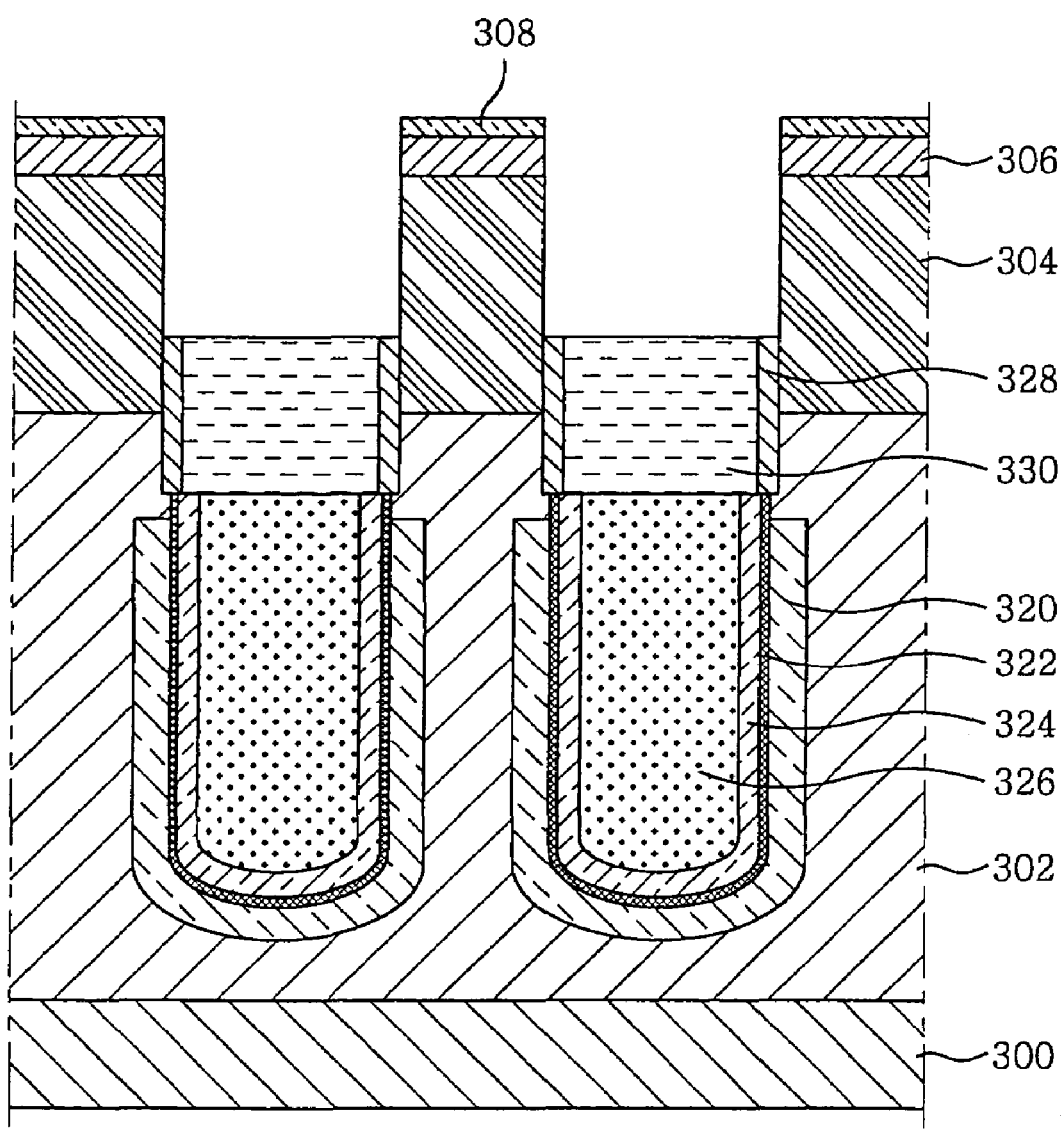

As illustrated in FIG. 3E, a fifth oxide layer 328, having a thickness of about several hundred angstroms, is then formed by thermal oxidation on a trench sidewall. Next, a storage node contact plug 330 is sequentially stacked to thereby fill the trench, and the fifth oxide layer 328 is etched back and then removed by wet etching.

Figure 3F:
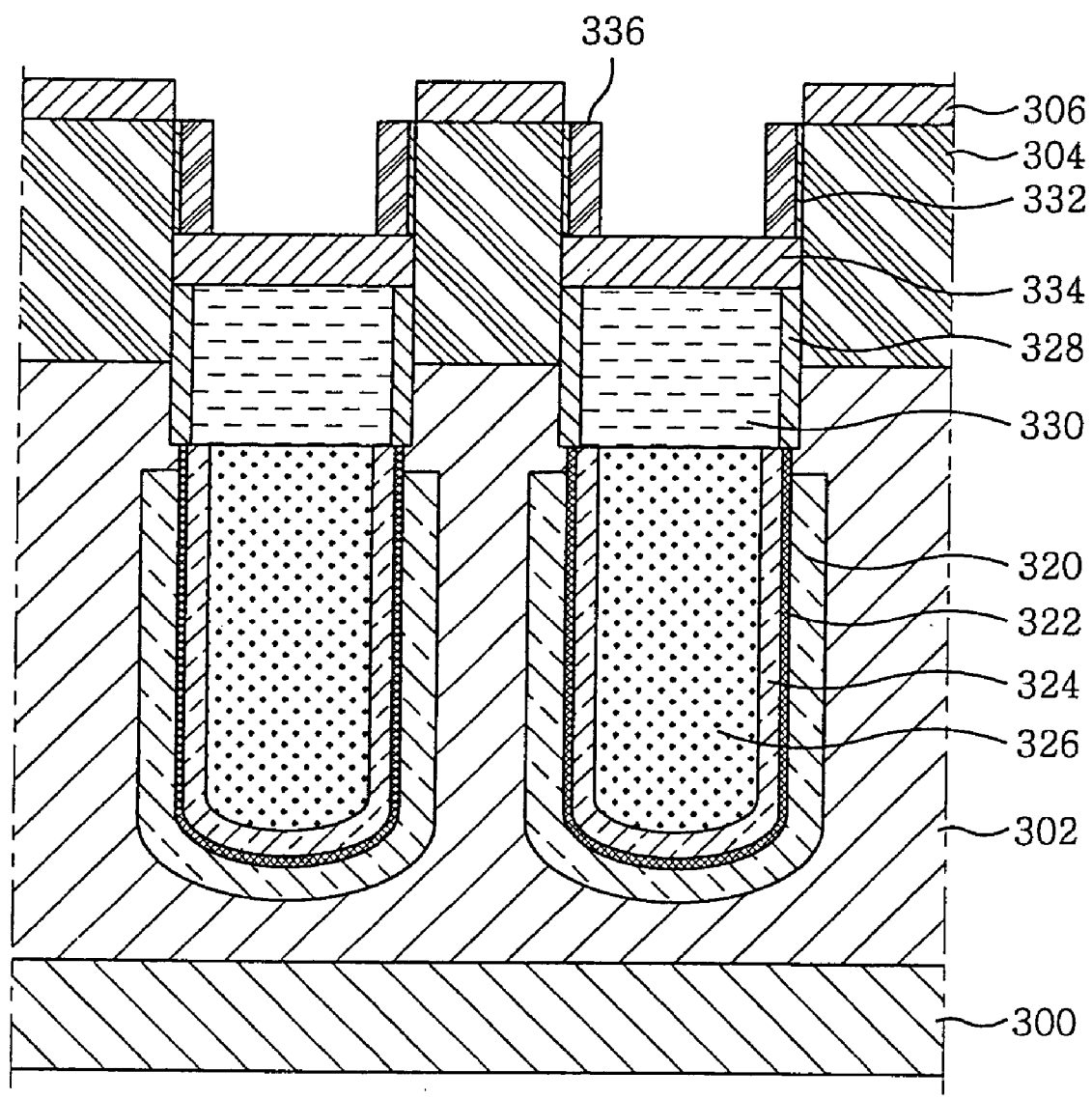

Referring to FIG. 3F, a sixth oxide film 332 is thinly formed by thermal oxidation on the trench sidewall over the storage node contact plug 330. Next, a seventh oxide film 334 is thickly stacked on the storage node contact plug 330, and then etched back to thereby form an insulation layer having a thickness of about several hundred angstroms or more. Next, a mask nitride film 336 is stacked on an inner surface of the sixth oxide layer 332 and then etched back.

Figure 3G:
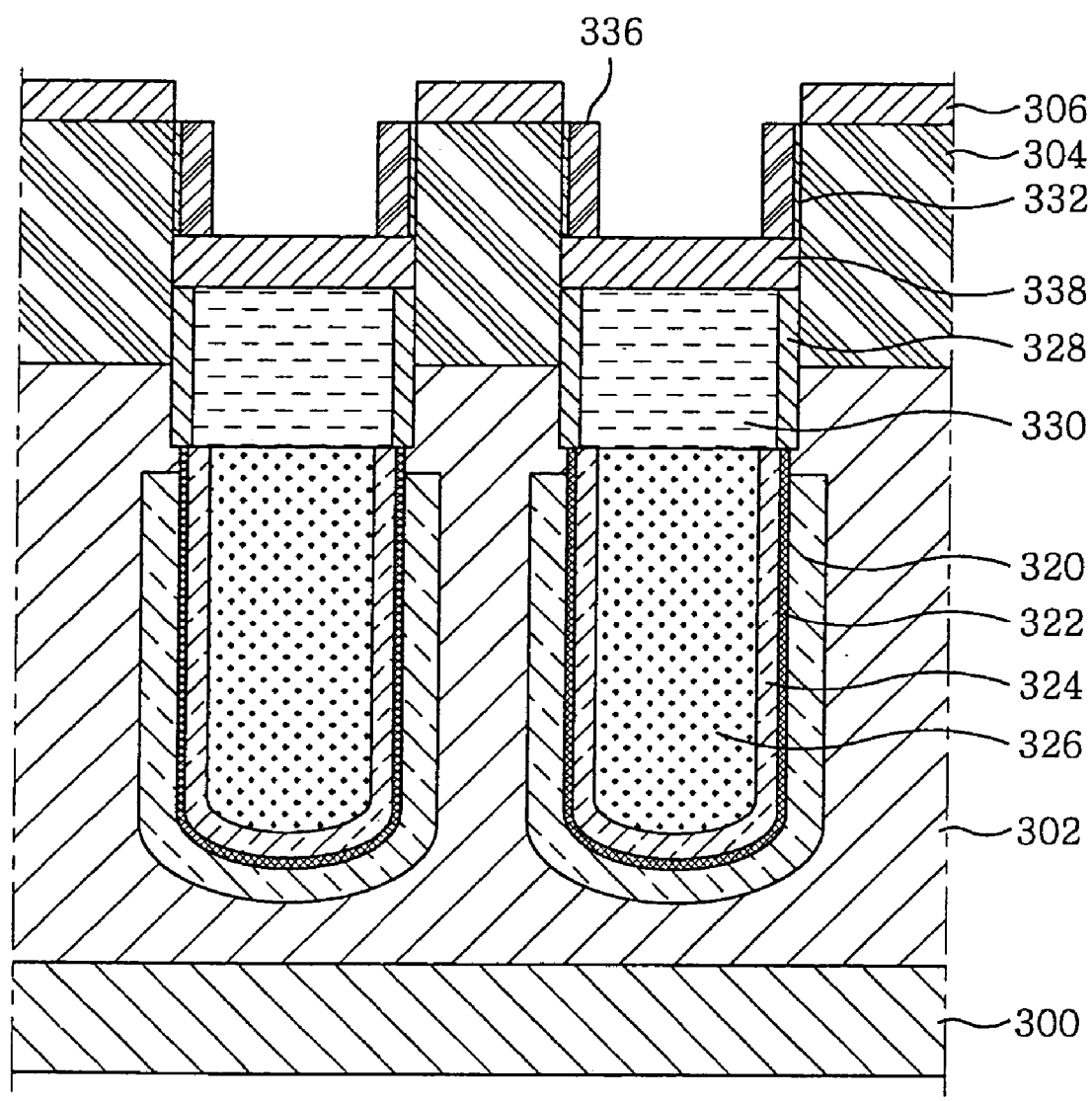

Referring to FIG. 3G, the seventh oxide film 334 is wet-etched. Next, the trench is filled with phosphorous-doped polysilsicon 335 on the storage node contact plug, and then it is etched back to thereby form a poly connector 338.

Figure 3H:
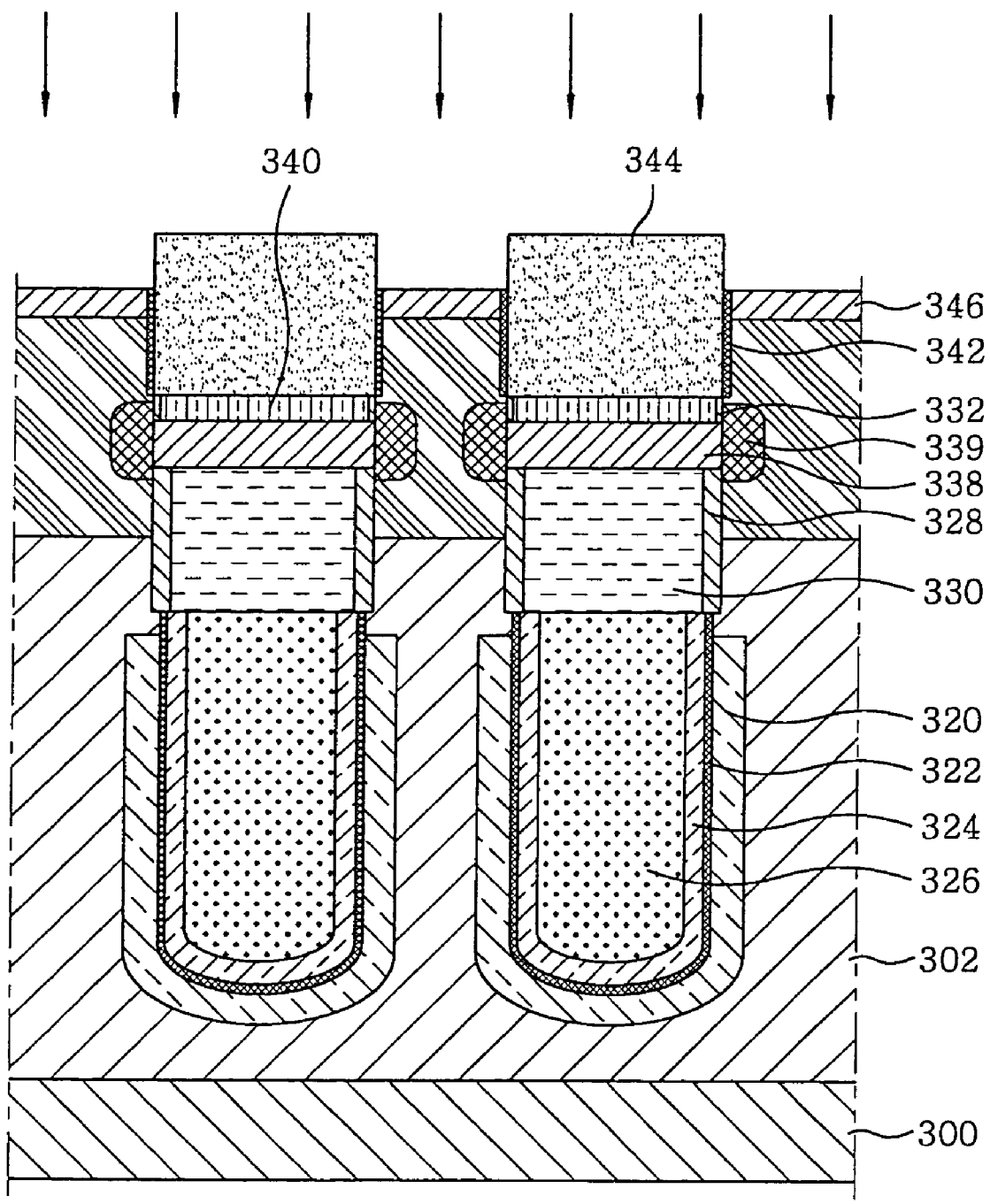
Figure 3I:
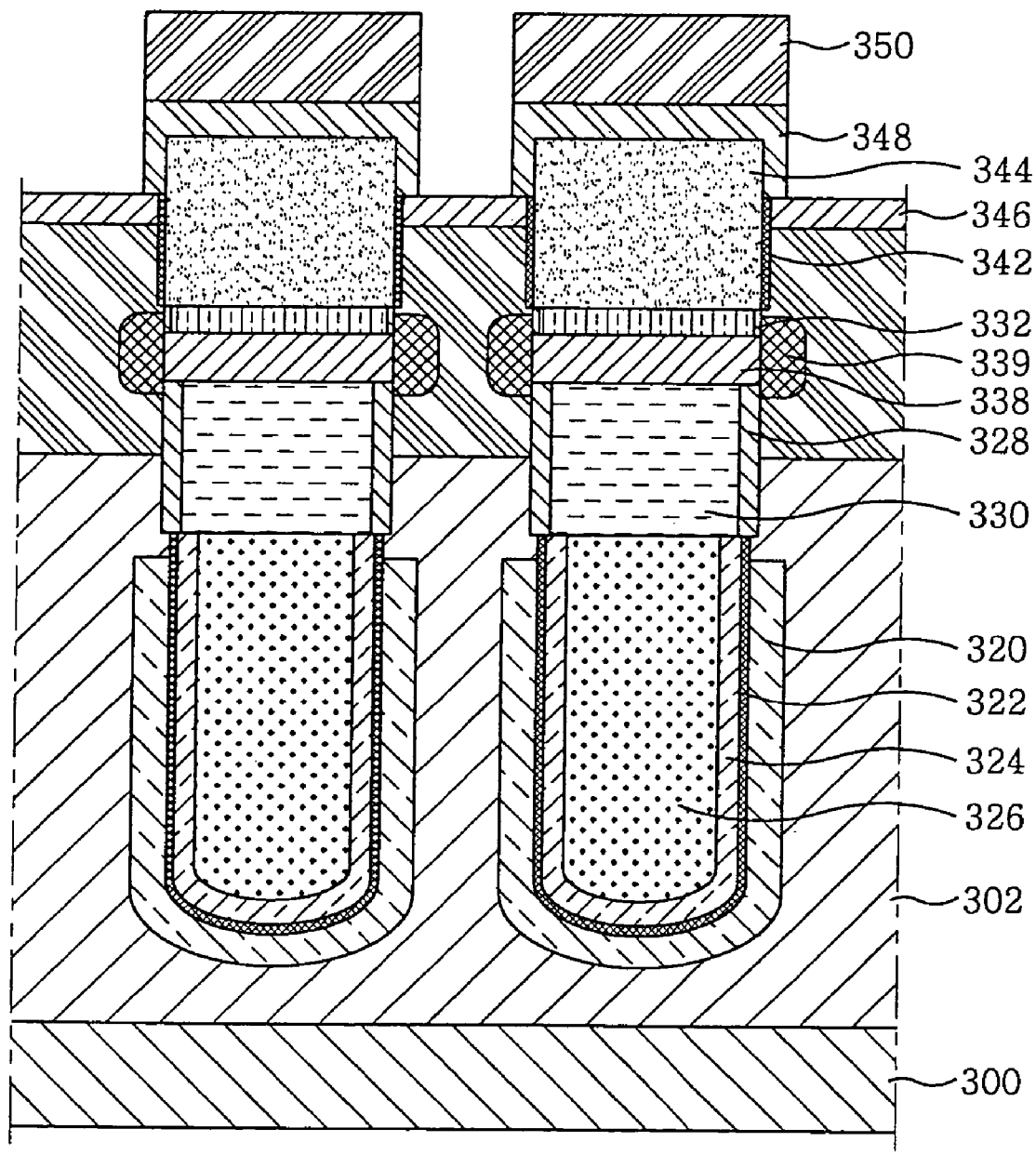

As illustrated in FIG. 3H, the poly connector layer 338 is then annealed so that phosphorous with which the poly connector material, i.e., the polysilicon, is doped diffuses into an adjacent trench sidewall silicon substrate to thereby form a source 339. Next, the mask nitride film 336 is removed by wet etching, and an eighth oxide film 340 is thickly deposited on the poly connector 338 to thereby fill the trench and then etched back. A gate insulation film 342 is then deposited on a trench sidewall over the eighth oxide film 340. And next, the trench over the eighth oxide film 340 is filled with polysilicon to thereby form a gate electrode 344 and an implanting process is performed to thereby form a drain 346 on a surface of the silicon substrate between consecutive gate electrodes. At this step, the gate electrode 344 is formed to protrude on the surface of the silicon substrate Referring to FIG. 3I, a caping nitride film is deposited on the entire silicon substrate, and then patterned to be removed by using a photoresist isolation mask 350 patterned through a photolithography process and an etching process, thereby exposing the drain 346.

Figure 3J:
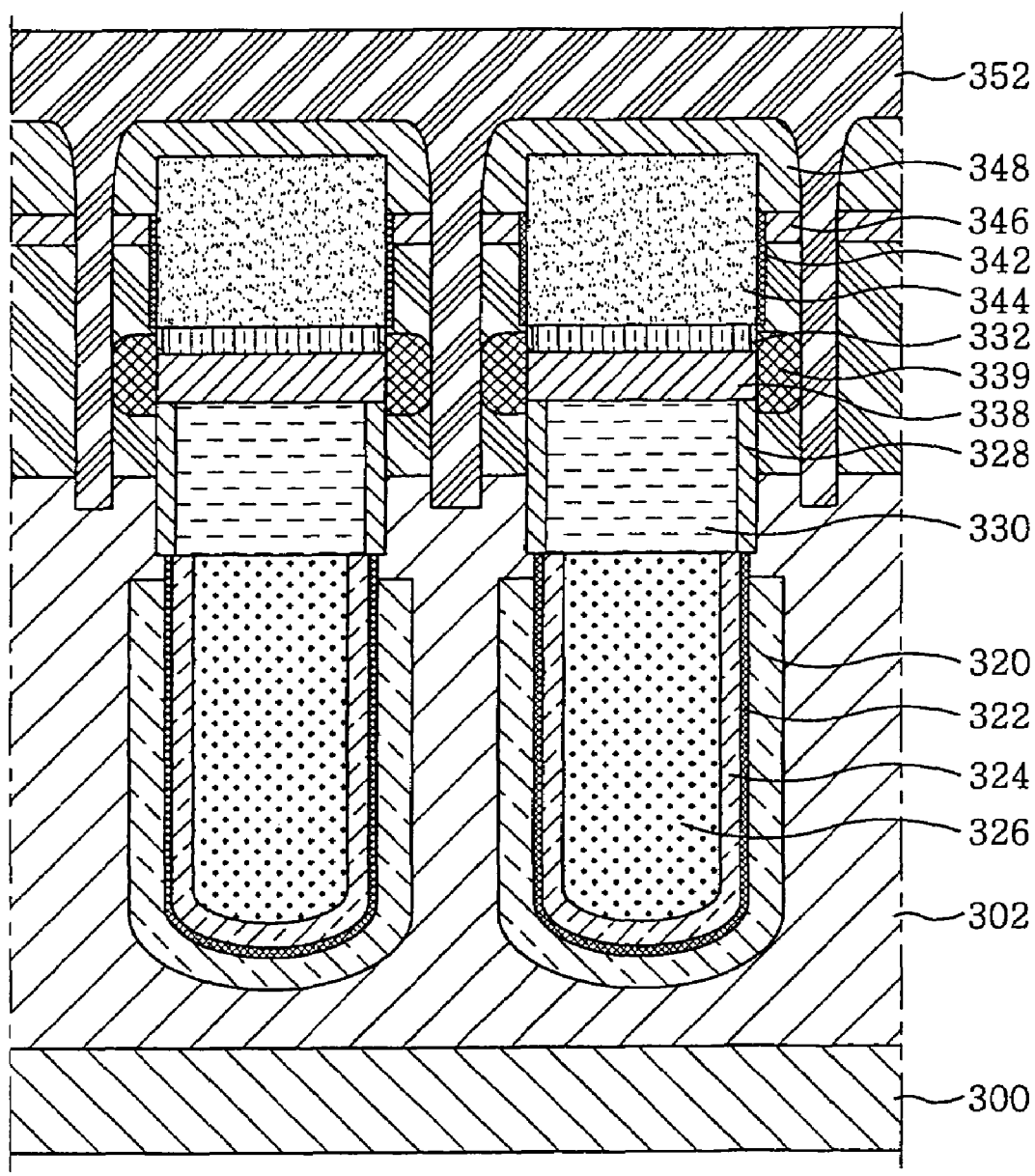

As illustrated in FIG. 3J, the photoresist isolation mask 350 is removed, and then the silicon substrate is dry-etched by a reactive ion etching (RIE) method employing the patterned caping nitride film 348 as a hard mask, to thereby expose the buried n-well region 302. The purpose of this etching process is isolating transistor devices in adjacent trenches from each other. A device isolation hole, being made during this etching process, preferably extends down to the buried n-well region 302. However, it is allowable that it extends down to the self-aligned source 339. Next, a device-isolating planarization oxide film 352 is thickly stacked in the device isolation hole, and then the silicon surface is planarized through a CMP process.

Figure 3K:
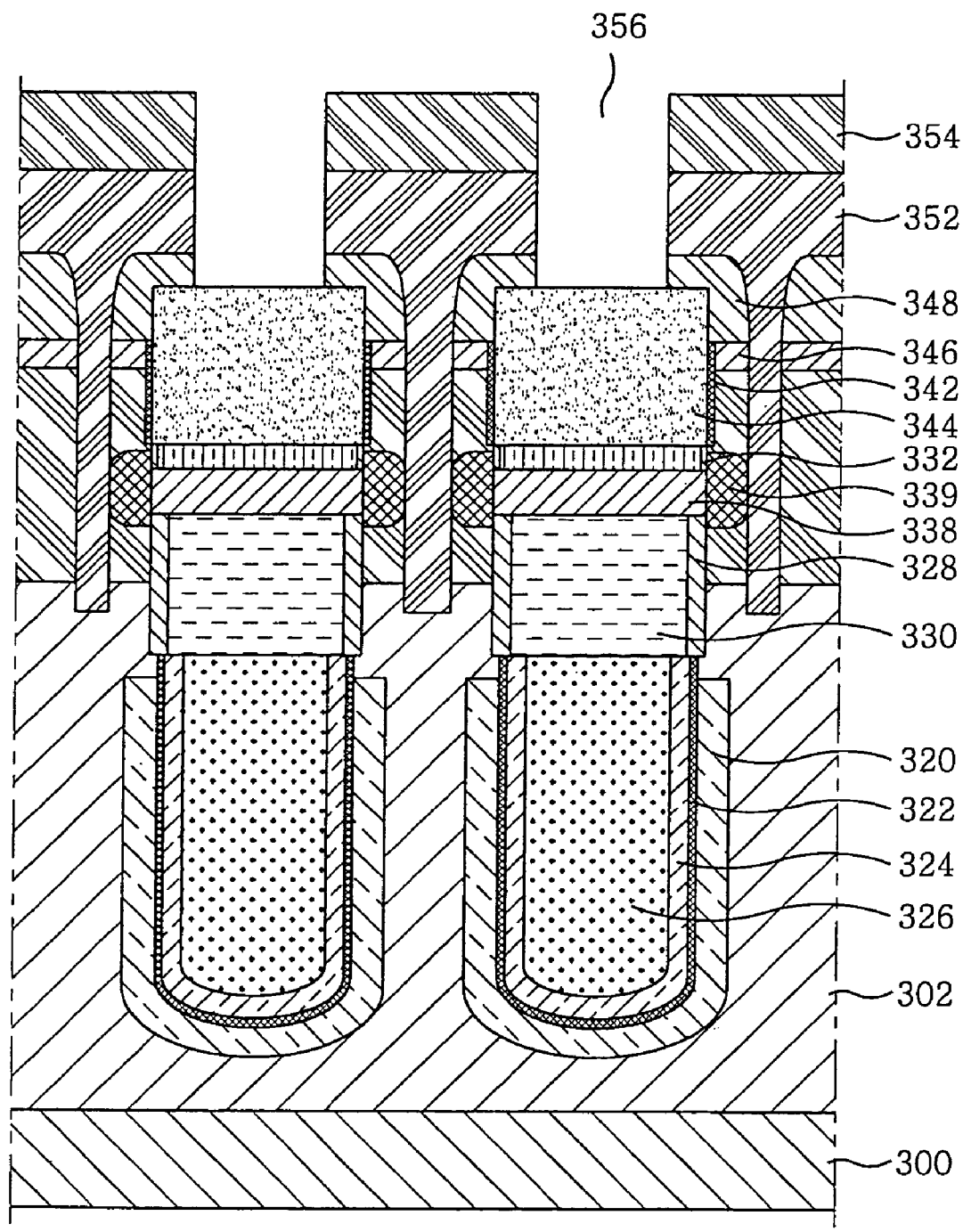

Referring to FIG. 3K, the device-isolating planarization oxide film 352 and the caping nitride film 348 are sequentially dry-etched by using a photoresist word-line mask 354 patterned through a photolithography process and an etching process, to thereby expose the gate electrode 344 so that a word-line contact hole 356 is formed.

Figure 3L:
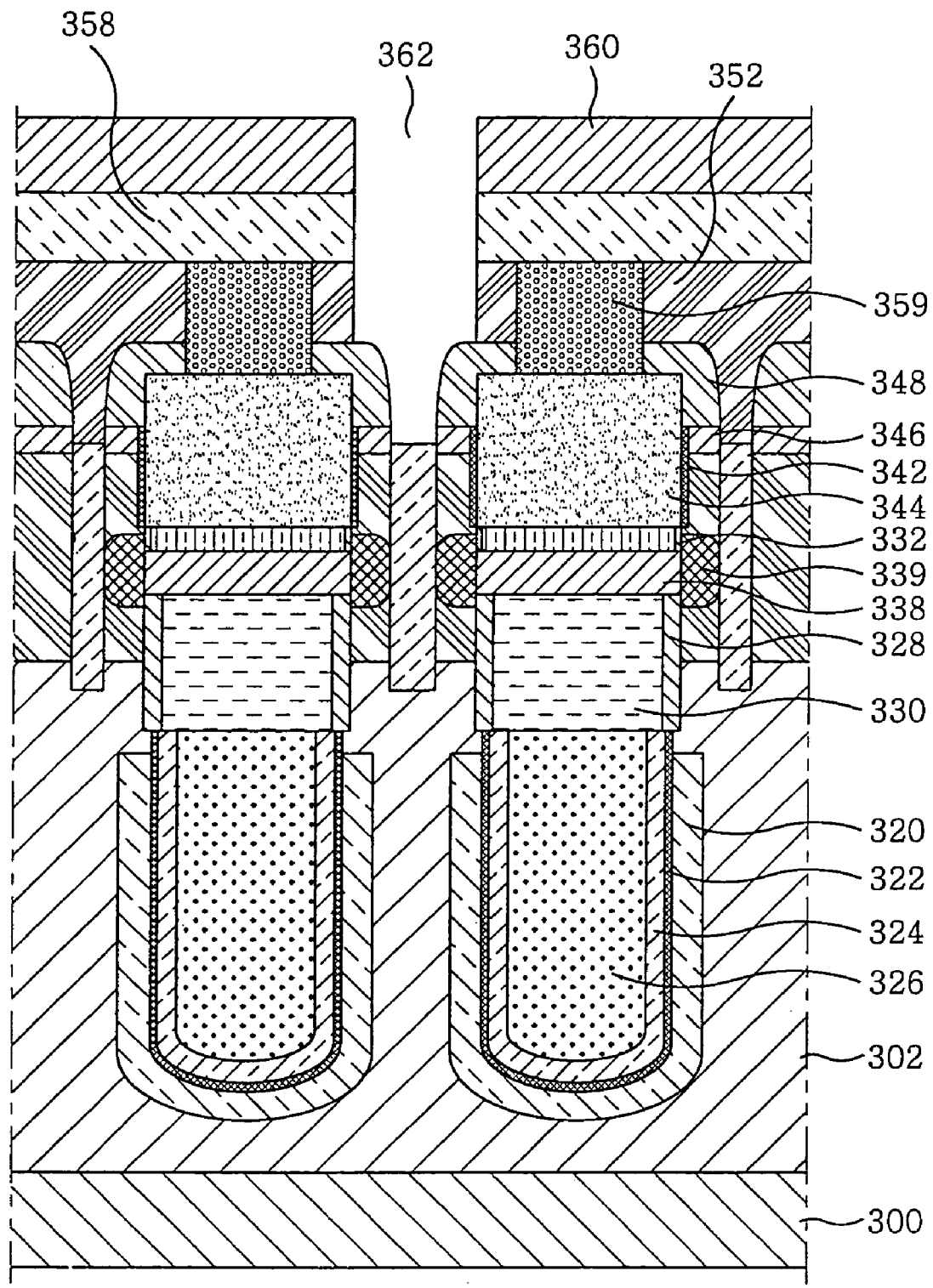

As illustrated in FIG. 3L, the photoresist word-line mask 354 is then removed, and the word-line contact hole 356 is filled with word-line electrode material, e.g., poly, poly electrode or tungsten, a word-line contact 359 is formed through a CMP process, and then a planarization oxide film 358 is deposited on the word-line 359. Next, the planarization oxide film 358 and the device-isolating planarization oxide film 352 are sequentially dry-etched by using a photoresist bit-line contact formation mask 360 patterned through a photolithography process and an etching process, to thereby expose the drain region so that a bit-line contact hole 362 is formed.

Figure 3M:
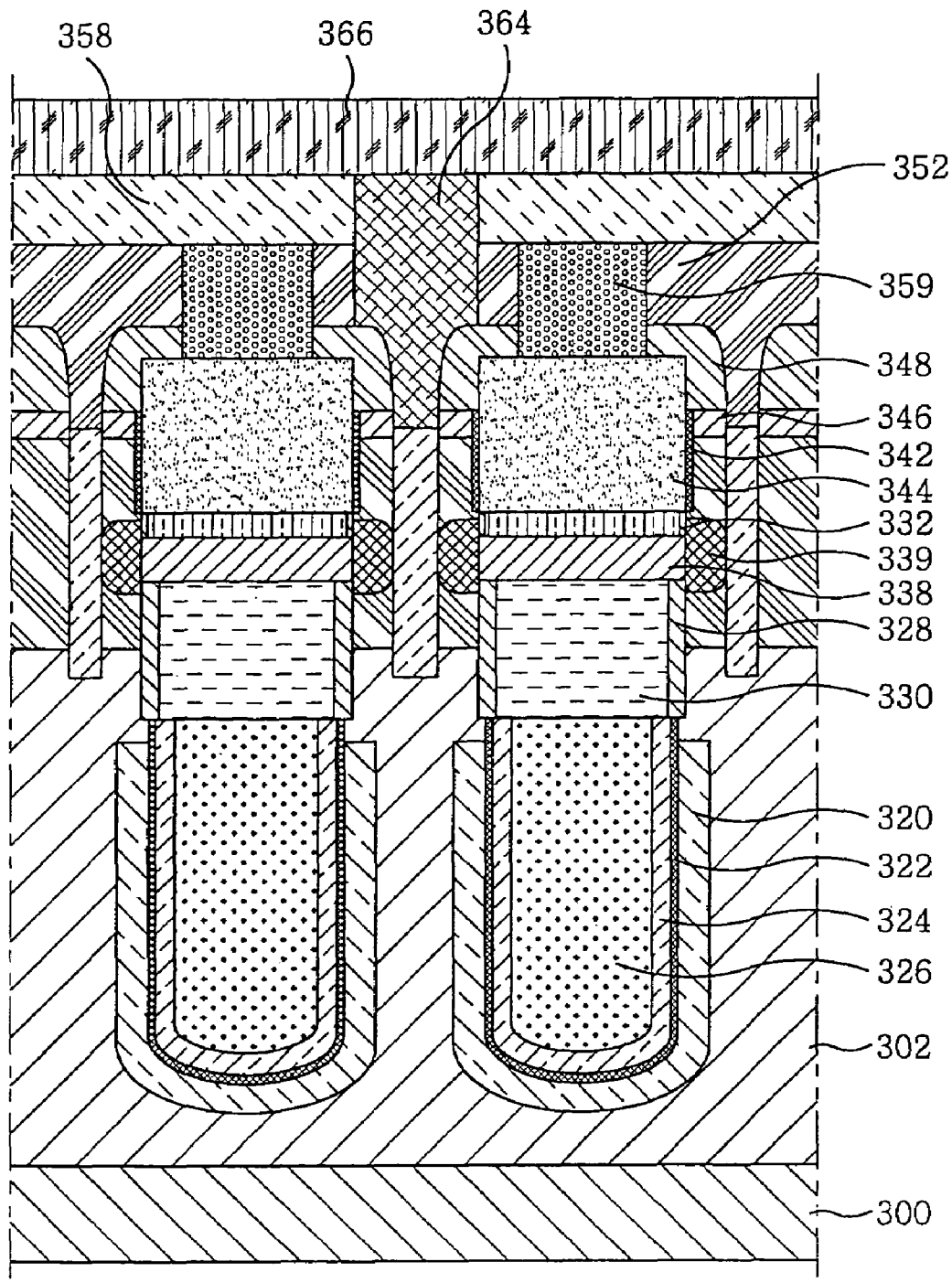

Referring to FIG. 3M, the bit-line contact hole 362 is filled with bit-line electrode material, and then a contact plug 364 is formed by planarization through the CMP process. Next, bit-line electrode material 366 is deposited on the contact plug 364. Then, performing a bit-line masking process, a bit-line is formed vertically to the word-line 359.

While the invention has been shown and described with respect to the preferred embodiments, it will be understood by those skilled in the art that various changes and modifications may be made without departing from the spirit and scope of the invention as defined in the following claims.

In accordance with the present invention, a cylindrical trench is formed in a silicon substrate, and a capacitor and a transistor are formed vertically and cylindrically in the trench, to thereby reduce a restraint of word-line size and length so that a high integration can be achieved.

What is claimed is:

1. A DRAM cell structure capable of high integration, comprising:
    a trench-type capacitor formed in a lower region of a trench, the trench being made vertically and cylindrically in a silicon substrate; and
    a transistor formed vertically and cylindrically over the trench-type capacitor, the transistor being connected to the capacitor, said transistor including,
    a storage node contact plug stacked over the trench-type capacitor;
    a source formed by being diffused into a p-well region of the silicon substrate of the trench sidewall;
    a poly connector stacked over the storage node contact plug, the poly connector connecting the plug and the source;
    a nitride film or an oxide film stacked over the poly connector to thereby isolate a gate electrode and the poly connector;
    a gate electrode stacked over the film, the gate electrode being connected to a word-line;
    a gate isolation film deposited on the silicon substrate of the trench sidewall adjacent to the gate electrode;
    a drain formed through an implanting process between gate electrodes, the drain being connected to a bit-line.

2. The DRAM cell structure of claim 1, wherein the trench-type capacitor includes:
    a plate electrode formed by being diffused into the silicon substrate of a lower sidewall of the trench;
    an insulator formed by being thinly deposited on the lower sidewall of the trench, the insulator being adjacent to the plate electrode;
    a storage node electrode formed on the insulator, corresponding to the plate electrode.

3. The DRAM cell structure of claim 2, wherein the insulator is a capacitor insulation film formed on the lower sidewall of the trench, the capacitor insulation film being capable of charge accumulation.

4. The DRAM cell structure of claim 2, wherein an oxide film is stacked in the trench in which the storage node electrode is formed.

5. The DRAM cell structure of claim 1, wherein the storage node contact plug is formed through a process of depositing an oxide film on the trench sidewall over the storage node electrode and stacking a contact conductor in the trench on which the oxide film is formed to thereby connect to the storage node electrode.

6. The DRAM cell structure of claim 5, wherein the storage node contact plug is formed in the buried n-well region and an n-well region of the silicon substrate in the trench.

7. The DRAM cell structure of claim 5, wherein the oxide film is formed by thermal oxidation to a depth of about several hundred angstroms or more.

8. The DRAM cell structure of claim 1, wherein the poly connector is formed by stacking polysilicon doped with n-type impurity over the storage node contact plug in the trench to thereby be connected to the storage node contact plug.

9. The DRAM cell structure of claim 1, wherein the source is formed by diffusing n-type impurity of poly connector material into an adjacent silicon substrate of the trench sidewall through an annealing process.

10. The DRAM cell structure of claim 1, wherein the gate electrode is formed by stacking polysilicon in the trench over the nitride film.

11. The DRAM cell structure of claim 10, wherein the gate electrode protrudes on the silicon substrate to a height of about several hundred angstroms or more.

12. The DRAM cell structure of claim 11, wherein the gate electrode is connected to a word-line of a DRAM cell via a word-line contact hole, the word-line contact hole being formed over the gate electrode by etching.

13. The DRAM cell structure of claim 12, wherein a word-line contact plug is formed by depositing poly electrode or tungsten in the word-line contact hole to thereby connect the gate electrode and the word-line.

14. The DRAM cell structure of claim 1, wherein the drain is connected to the bit-line of the DRAM cell via a bit-line contact hole, the bit-line contact hole being formed over the drain by etching.

15. The DRAM cell structure of claim 14, wherein a bit-line contact plug is formed by depositing poly, poly electrode or tungsten in the bit-line contact hole, to thereby connect the bit-line and the drain.

16. The DRAM cell structure of claim 14, wherein a device isolation film is formed between the drain region and the p-well region to thereby isolate transistor devices in adjacent trenches.

17. The DRAM cell structure of claim 16, wherein the device isolation film is of SOI structure for a device unit, the device isolation film being formed by stacking an oxide film on a device isolation hole, the device isolation hole being formed in the drain region and the p-well region by etching.

18. The DRAM cell structure of claim 16, wherein the bit-line connects two transistor devices in adjacent trenches.

19. A DRAM cell structure capable of high integration, comprising:
a trench-type capacitor formed in a lower region of trench, the trench being made vertically and cylindrically in a silicon substrate and including,
a plate electrode formed in a buried n-well region in the silicon substrate by diffusing n-type impurity of an LPTEOS layer into the silicon substrate of a lower sidewall of the trench;
an insulator formed by being deposited on the lower sidewall of the trench, the insulator being adjacent to the plate electrode;
a storage node electrode formed on the insulator, corresponding to the plate electrode; and
a transistor formed vertically and cylindrically over the trench-type capacitor, the transistor being connected to the capacitor.

20. A DRAM cell structure of claim 19, wherein said transistor includes:
a storage node contact plug stacked over the trench-type capacitor;
a source formed in a p-well region of the silicon substrate of the trench sidewall;
a poly connector stacked over the storage node contact plug, the poly connector connecting the plug and the source;
nitride film or an oxide film stacked over the poly connector to thereby isolate the poly connector;
a gate electrode stacked over the film, the gate electrode being connected to a word-line;
a gate isolation film deposited on the silicon substrate of the trench sidewall adjacent to the gate electrode; and
a drain formed between gate electrodes, the drain being connected to a bit-line.

* * * * *